US008609540B2

(12) United States Patent
Uzoh et al.

(10) Patent No.: US 8,609,540 B2
(45) Date of Patent: Dec. 17, 2013

(54) RELIABLE PACKAGING AND INTERCONNECT STRUCTURES

(75) Inventors: Cyprian Uzoh, San Jose, CA (US); Belgacem Haba, Saratoga, CA (US); Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 92 days.

(21) Appl. No.: 13/164,448

(22) Filed: Jun. 20, 2011

(65) Prior Publication Data

US 2012/0319282 A1   Dec. 20, 2012

(51) Int. Cl.
*H01L 21/32* (2006.01)

(52) U.S. Cl.
USPC ........................................... 438/687

(58) Field of Classification Search
USPC .......... 257/758–763; 438/666, 687, 622, 586
See application file for complete search history.

(56) References Cited

U.S. PATENT DOCUMENTS

| | | | |
|---|---|---|---|
| 8,158,532 B2* | 4/2012 | Mayer et al. | 438/754 |
| 2006/0216929 A1* | 9/2006 | Park et al. | 438/637 |
| 2009/0277867 A1* | 11/2009 | Mayer et al. | 216/13 |
| 2009/0280649 A1* | 11/2009 | Mayer et al. | 438/676 |
| 2012/0319282 A1* | 12/2012 | Uzoh et al. | 257/763 |
| 2012/0326313 A1* | 12/2012 | Uzoh et al. | 257/751 |
| 2012/0326326 A1* | 12/2012 | Uzoh et al. | 257/774 |

* cited by examiner

*Primary Examiner* — Nathan Ha
(74) *Attorney, Agent, or Firm* — Lerner, David, Littenberg, Krumholz & Mentlik, LLP

(57) ABSTRACT

Methods and apparatus for forming a semiconductor device are provided which may include any number of features. One feature is a method of forming an interconnect structure that results in the interconnect structure having a top surface and portions of the side walls of the interconnect structure covered in a dissimilar material. In some embodiments, the dissimilar material can be a conductive material or a nano-alloy. The interconnect structure can be formed by removing a portion of the interconnect structure, and covering the interconnect structure with the dissimilar material. The interconnect structure can comprise a damascene structure, such as a single or dual damascene structure, or alternatively, can comprise a silicon-through via (TSV) structure.

37 Claims, 8 Drawing Sheets

RELIABLE PACKAGING AND INTERCONNECT STRUCTURES

INCORPORATION BY REFERENCE

All publications, including patents and patent applications, mentioned in this specification are herein incorporated by reference in their entirety to the same extent as if each individual publication was specifically and individually indicated to be incorporated by reference.

FIELD OF THE INVENTION

The present invention relates generally to semiconductor device and methods pertaining to their manufacture. More specifically, the disclosure relates to devices and methods for improving reliability of multiple interconnect structures and eliminating scattering caused by traditional etch-stop layers.

BACKGROUND OF THE INVENTION

Semiconductor chips are fabricated on suitable flat substrate wafers, such as GaAs, diamond coated substrates, silicon carbide, silicon wafers, etc. After making the active devices, a series of steps are performed to connect the various devices with highly conducting wiring structures, so they can have communication with each other to perform logic operations. These wiring structures or interconnect structures are essentially a skeletal network of conducting materials, typically metals in a matrix of dielectric materials. In high performance devices and to improve device density and yield, it is imperative to minimize topographic features within the interconnect layers for any given device and across the entire substrate. One common method of forming these high performance interconnect layers is the damascene process.

Multiple types of damascene structures are known, however the single and dual damascene are the most common. In single damascene, each metal or via layer is fabricated in a series of operations, while in dual damascene, a metal level and a via level are fabricated in a single operation. Of these two, the dual damascene step is often preferred because of lower cost and higher device performance.

In the dual damascene process, a suitable substrate with or without devices is coated with a suitable resist layer. The resist layer is imaged to define desirable patterns by lithographic methods on the substrate. Cavities are etched on the patterned substrates typically by reactive ion etching methods, RIE. The patterned substrate is then coated with a suitable barrier/seed layer prior to overfilling the cavities with a suitable metal, typically copper by electro-deposition from a superfilling plating bath chemistry.

During the damascene process, etch-stop layers are formed between the various layers of the semiconductor device to control the profile of the cavities within the dielectric layer and often may serve as a capping layer. In practice, the dielectric constants of the etch-stop materials tend to be higher than that of the bulk dielectric material. For example, the dielectric constant of fluorinated silicon oxide insulator is 3.5, whereas the typical silicon nitride used as an etch-stop layer is between 7 and 9.

However, etch-stop layers require additional processing time and expense to form and remove, the adhesion of the etch-stop to the metal surface is a reliability concern, because they are often the origin of delamination within the substrate. Also, the presence of the high dielectric constant etch-stop increases the effective capacitance of the device, causes higher RC delay, and can cause unwelcomed stray capacitance as well as undesirable scattering in optical devices.

SUMMARY OF THE DISCLOSURE

In one embodiment, a method of manufacturing a semiconductor device is provided, comprising forming an interconnect structure on a substrate, the interconnect structure having a top surface and a plurality of side walls, removing a portion of the top surface and side walls of the interconnect structure, and covering the top surface and a portion of the side walls of the interconnect structure with a dissimilar material.

In some embodiments, the dissimilar material is conductive. In other embodiments, the dissimilar material is non-conductive.

In some embodiments, the dissimilar material comprises a coupling layer. In additional embodiments, the dissimilar material comprises an adhesion layer, a conducting isolation layer, or a barrier layer.

In various embodiments, the interconnect structure is a damascene structure, a non-damascene structure, or combinations thereof. In some embodiments, the interconnect structure is a dual damascene structure. In other embodiments, the interconnect structure is a through-silicon via (TSV) structure. In many embodiments, the interconnect structure comprises copper.

In some embodiments, the dissimilar material comprises a nano-metal. The dissimilar material can comprise any suitable nano-metal or other material, including CoP, NiP, or NiW.

In some embodiments, the covering step comprises covering the top surface and a portion of the side walls of the interconnect structure with a dissimilar material having a grain size between 0.5 to 100 nm. In other embodiments, the covering step comprises covering the top surface and a portion of the side walls of the interconnect structure with a dissimilar material having a thickness of between 2 to 500 nm, or between 2 to 1000 nm, or between 2 to 2500 nm, or between 2 to 5000 nm or more. In additional embodiments, the covering step comprises covering the top surface and a portion of the side walls of the interconnect structure with a dissimilar material having a thickness of between 5 to 200 nm.

In some embodiments, the method further comprises coating the dissimilar material with a solderable material.

In some embodiments, the dissimilar material does not etch with the interconnect structure.

In various embodiments, the covering step further comprises covering at least 10% of side walls the interconnect structure with the dissimilar material. In other embodiments, the covering step further comprises covering at least 33% of side walls the interconnect structure with the dissimilar material.

In one embodiment, the removing step further comprises oxidizing a portion of the interconnect structure, and removing the oxidized portion of the interconnect structure. In other embodiments, the removing step comprises removing a portion of the side walls along at least 10% of a length of the side walls of the interconnect structure. In additional embodiments, the removing step comprises removing a portion of the side walls along at least 33% of a length of the side walls of the interconnect structure.

In another embodiment, a semiconductor device is provided, comprising a substrate, an interconnect structure disposed on the substrate, the interconnect structure having a top surface and a plurality of side walls, and a dissimilar material disposed on and covering the top surface and a portion of the side walls of the interconnect structure.

In some embodiments, the dissimilar material is conductive. In other embodiments, the dissimilar material is nonconductive.

In one embodiment, the dissimilar material comprises a coupling layer. In other embodiments, the dissimilar material can comprise an adhesion layer, a conducting isolation layer, or a barrier layer.

In various embodiments, the interconnect structure is a damascene structure. In another embodiment, the interconnect structure is a dual damascene structure. In an additional embodiment, the interconnect structure is a TSV structure. In some embodiments, the interconnect structure comprises copper.

In some embodiments, the dissimilar material comprises a nano-metal. In other embodiments, the dissimilar material comprises CoP. In additional embodiments, the dissimilar material comprises NiP or NiW.

In some embodiments, the dissimilar material has a grain size between 0.5 to 100 nm. In additional embodiments, the dissimilar material has a thickness of between 2 to 500 nm. In some embodiments, the dissimilar material has a thickness of between 5 to 200 nm.

In one embodiment, the semiconductor device further comprises a solderable material disposed on the dissimilar material.

In one embodiment, the dissimilar material covers at least 10% of the side walls of the interconnect structure. In an additional embodiment, the dissimilar material covers at least 33% of the side walls of the interconnect structure.

DETAILED DESCRIPTION

Various embodiments of interconnect structures and methods of forming them are described herein. In one embodiment, a portion of an interconnect structure is removed, and a top surface and portions of the side walls of the interconnect structure are covered with a dissimilar material. The dissimilar material can be, for example, a conductive material such as a nano-alloy. Further details on the various embodiments and their benefits will be described below.

Figure 1A:
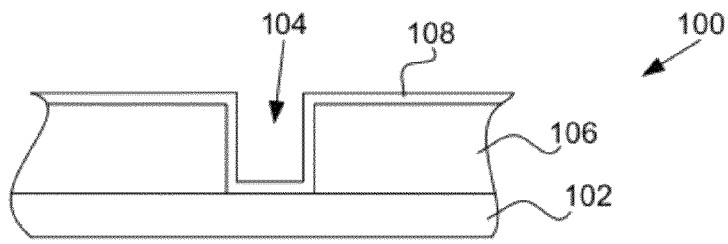
FIGS. 1A-1H illustrate one method of forming a semiconductor interconnect structure.

FIGS. 1A-1F illustrate one method and approach for forming an interconnect structure on a semiconductor device 100. FIG. 1A illustrates a substrate 102 having cavity 104 formed in an insulator layer 106 on the substrate. The cavities can be formed by any process known in the art, such as by coating the substrate and insulator with a suitable resist layer, imaging the resist layer to define lithographic patterns on the substrate, and etching the cavities on the patterned substrate, such as with a reactive ion etching (RIE) method. The substrate can comprise any suitable substrate used in semiconductor and/or packaging devices, such as silicon, glass, sapphire, silicon carbide, diamond, compound semiconductors, for example.

Figure 1B:
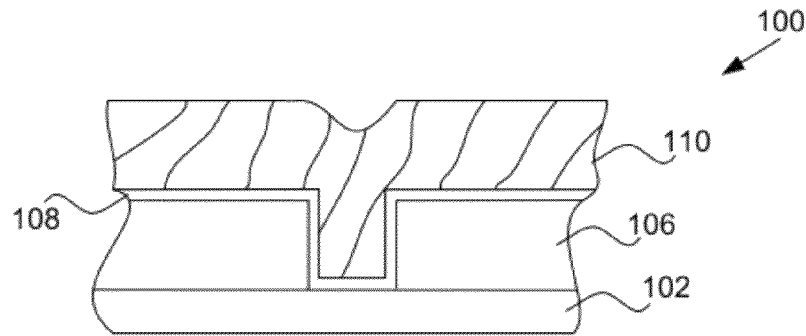
Figure 1C:
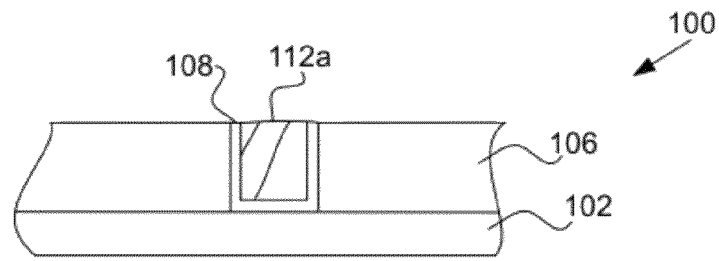
Figure 1D:
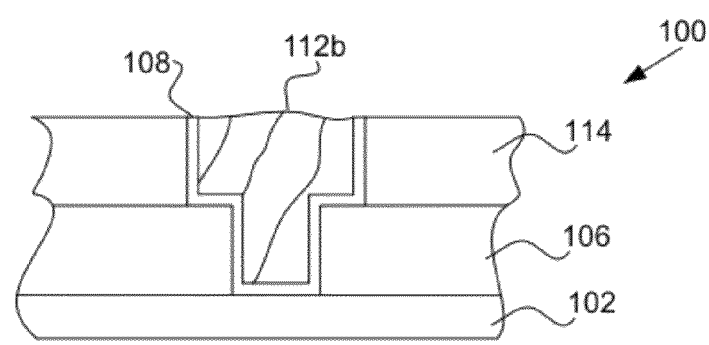

FIGS. 1A-1C illustrate the formation of a single damascene interconnect structure 112a, however a dual damascene interconnect structure 112b formed in the same manner is illustrated in FIG. 1D.

Referring still to FIG. 1A, a barrier/seed layer 108 can be deposited on the insulator, including on the top surface of the insulator and on the side and bottom walls of cavity 104. Looking to FIG. 1B, after application of the barrier/seed layer, a conductor 110 can be deposited on the barrier/seed layer 108 to overfill the cavity. In various embodiments, the conductor can comprise copper, nickel, tungsten, gold, aluminum, or their various alloys. In one embodiment, the conductor comprises copper and is deposited on the barrier layer or on a seed layer or precursor layer inside the cavities by electro-deposition from a superfilling plating bath chemistry. Also, conductors may be coated by electroless methods, with suitable additives to enhance and induce void-free gap fill.

Next, the conductor coated substrate can be removed/polished to remove excess conductor and barrier/seed layer from the semiconductor device. In some embodiments, this process is achieved with a chemical-mechanical polishing (CMP) or electro-chemical-mechanical polishing (ECMP) device. FIG. 1C illustrates the remaining conductor portion as interconnect structure 112a within the cavity (e.g., within cavity 104), after the removing or polishing step. Similarly, FIG. 1D illustrates the end result of a dual damascene interconnect structure 112b if the dual damascene process were used instead. The dual damascene interconnect structure 112b requires the formation of a second insulator layer 114.

At this point in the process, a conventional technique is to form a high dielectric constant etch-stop layer over the substrate before processing additional layers of electrical structures on the substrate. Typically the dielectric constant of the etch-stop is higher than that of the insulator 106. The addition of etch-stop or materials with higher dielectric constants can increase the effective dielectric constant the device, which may increase the device RC delay and also increase undesirable signal scattering and losses in optical devices.

However, as described above, these etch-stop layers can have a deleterious effect on the final semiconductor device. Exemplary embodiments of the present invention result in higher quality and more reliable interconnect structures and semiconductor devices without having to form a conventional etch-stop layer with the various dielectric stacks.

Figure 1E:
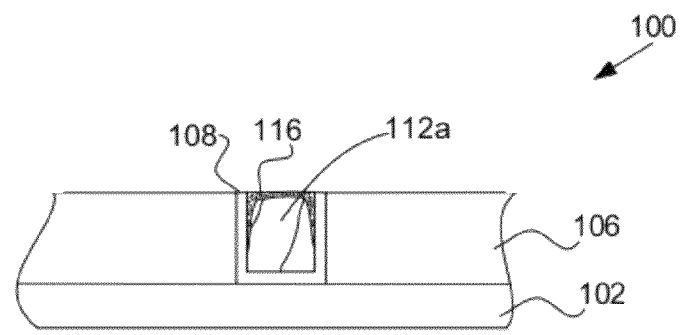

Referring now to FIG. 1E and interconnect structure 112a on semiconductor device 100, a portion of the interconnect structure can be oxidized, such as with a dry or wet oxidation process as known in the art. In one embodiment, the plated metal for example copper may be oxidized at temperatures below 150 degrees C. for 1 to 30 minutes in oxygen bearing environment to form the layer 116. The oxidized layer may be removed with dilute mineral or dilute organic acid or both or combination of both. For example, the oxidized layer may be removed with 0.3 to 5% dilute sulfuric acid and the acid solution may contain wetting agents or surfactants to improve removal uniformity and also reduce the roughing of the surface of the etch metal. In other embodiments, the cavity for the dissimilar material may be created by etching top and sidewall portions of the in cavity 104 in a suitable copper etchant for example in a solution containing 0.5 to 5% inorganic or organic peroxide and 0.3 to 5% sulfuric acid or sulfonic acid. It is preferable that the etching solution contains surfactants and other processing aid to improve etching uniformity while minimizing the roughness of the etched metal. Also dilute organic acid may be used in place of mineral acids. After the etching step the substrate is cleaned to remove all undesirable residues and dried by known methods.

The oxidation process can form an oxidation layer 116 on a top surface of the interconnect structure, as well as along portions of the sidewalls of the interconnect structure near the barrier layer 108. In one embodiment where the interconnect structure comprises copper, the oxidation process forms a copper oxide layer. In some embodiments, the amount of the side wall to be oxidized can be at least 5%, 10%, 33%, or even 50% or more of a length of the sidewalls of the interconnect structure.

Figure 1F:
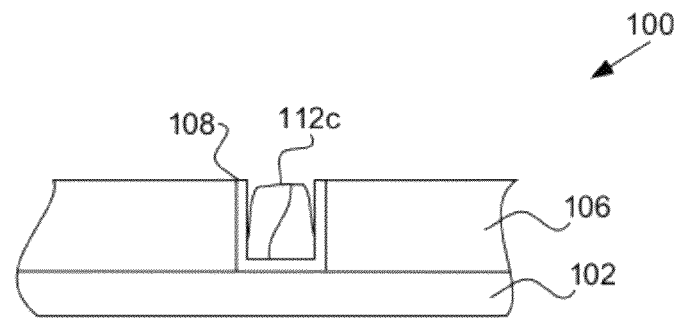

The oxidation layer 116 on interconnect structure 112a from FIG. 1E can then be removed, which essentially removes a portion of the top surface and side walls of the interconnect structure. In one embodiment, the oxidation layer 116 can be removed with a wet etch process. Additionally, in various embodiments, the remaining interconnect structure can undergo an annealing process to enlarge the grain size of the conductor. A new interconnect structure 112c, with a portion of its top surface and side walls removed and having an enlarged grain, is shown in FIG. 1F. In one embodiment the coated metal is not annealed prior to subsequent step. It can be seen from FIG. 1F that small gaps appear between the sidewalls of the interconnect structure 112a and the barrier layer 108. As shown, a portion of the sidewalls along approximately 50% of the length of the sidewalls has been removed. However, it should be understood that a portion of the sidewalls along any percentage of the length of the sidewalls can be removed, but preferably along at least 5%, 10%, 33%, 50%, or more of the length of the sidewalls.

Figure 1G:
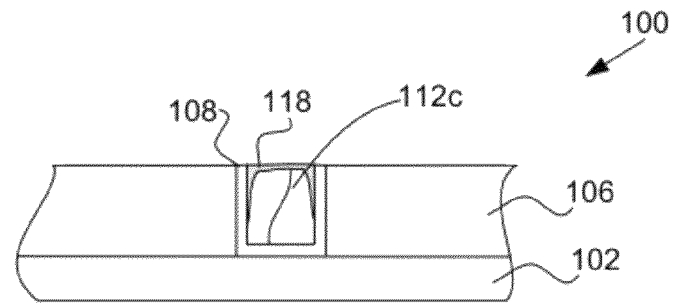

In FIG. 1G, the process continues by covering the top surface and a portion of the side walls of the interconnect structure 112c with a dissimilar material 118. In some embodiments, the dissimilar material can be a conductive material or conductive metal. In other embodiments, the dissimilar material can be a non-conductive material. In various embodiments, the dissimilar material can comprise a coupling layer, an adhesion layer, a conducting isolation layer, or a barrier layer. In other embodiments, the dissimilar material can be a nano-metal or nano-alloy, such as CoP, NiP, or NiW, CoWP, multiple layers of dissimilar alloys, multiple layers of the same alloying elements and each layer within the laminated possessing different atomic compositions. More than one layer may be used, for example the dissimilar material may be CoP/NiP or CoP/NiW and in some applications multiple layers of NiW alloy may be used, for example a two layer laminate, the inner layer may contain 5 to 10% tungsten and the outer layer may contain 18 to 30% and vice versa. The structure of the dissimilar material may be amorphous, also their grain size may vary between 0.5 to 700 nm, but also between 5 to 200 nm. In some embodiments, a nano-metal or nano-alloy may be defined as a material having a grain size of less than 1 micron.

The dissimilar material 118 may be coated by known method such as ALD, CVD, sputtering, electroplating, electroless or screen printing, amongst others. In one embodiment, the material 118 may be selectively coated by electroless deposition of CoWP or CoP or laminate of CoWP/NiP on the interconnect structure. In one embodiment, referring to FIG. 1B, the plated metal 110 is removed, but not the barrier layer 108. The barrier layer 108 is then used to carry current for the selective electrolytic deposition of 118 in the cavities of interest. After deposition of the dissimilar material, the barrier material and any spurious coating on the barrier layer is removed by CMP methods.

As shown, a portion of the sidewalls along approximately 50% of the length of the sidewalls has been covered with the dissimilar material. However, it should be understood that a portion of the sidewalls along any percentage of the length of the sidewalls can be covered with the dissimilar material, but preferably along at least 5%, 10%, 33%, 50%, or more of the length of the sidewalls. In one embodiment, the dissimilar material 118 can have a grain size of between approximately 0.5 to 100 nm. In another embodiment, the dissimilar material can have a thickness ranging from between approximately 2 to 500 nm, or between 2 to 1000 nm, or between 2 to 2500 nm, or between 2 to 5000 nm or more, or alternatively, from between approximately 5 to 200 nm.

Figure 1H:
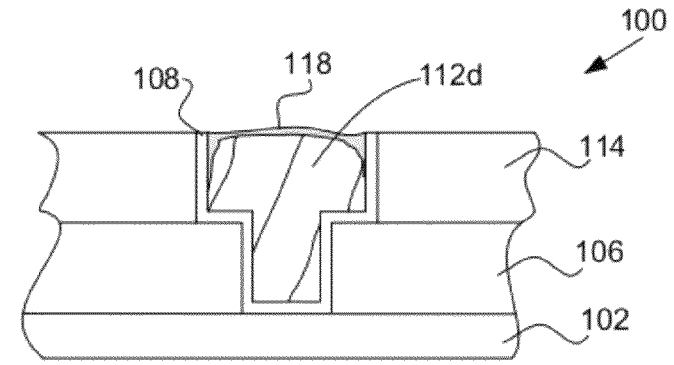

Still referring to FIG. 1G, the resultant structure from this process is a semiconductor device 100 having a substrate 102, an interconnect structure (e.g., single damascene interconnect structure 112c in FIG. 1G, or dual damascene interconnect structure 112d in FIG. 1H) disposed on the substrate, and a dissimilar material 118 disposed on and covering the top surface and a portion of the side walls of the interconnect structure.

Figure 2A:
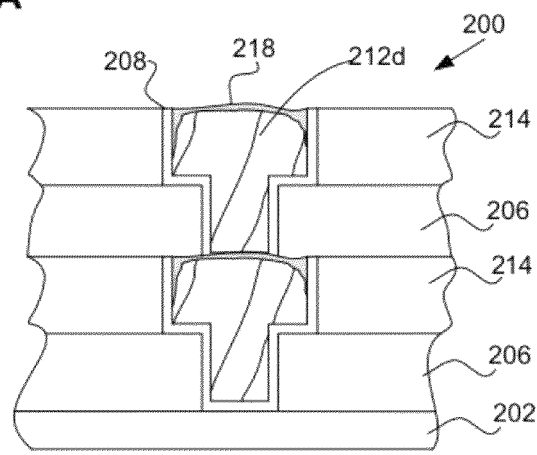
FIGS. 2A-2C illustrate another method of forming a semiconductor interconnect structure.

FIG. 2A illustrates a multiple dual damascene structure 200 according to one embodiment, including substrate 202, insulation layers 206 and 214, interconnect structures 212d, barrier layer 208, and dissimilar material 218 disposed on and covering the interconnect structures. In one embodiment, the insulator 206 and 214 are the same material and there is no other dielectric layer with higher dielectric constant separating insulators 206 and 214, and the dissimilar material 118 covering the coated metal may act as etch-stop to control the profile of the etch cavities during RIE etching of the insulator for example.

Figure 3A:
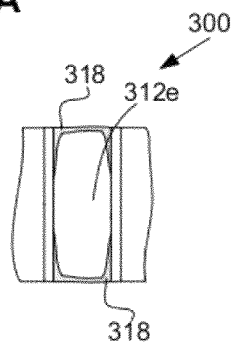
FIGS. 3A-3B illustrate another method of forming a semiconductor interconnect structure.
Figure 2B:
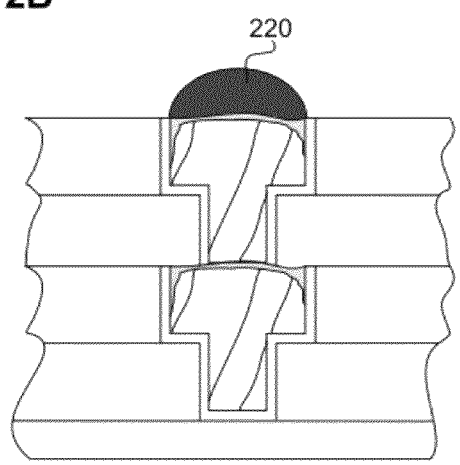
Figure 3B:
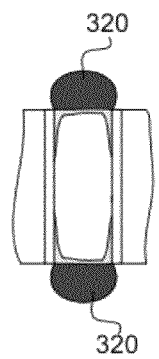

FIG. 3A illustrates one embodiment, where the interconnect structure 312e comprises a through-silicon via (TSV) structure 300 covered with a dissimilar material 318 on one or both sides of the interconnect structure. In additional embodiments, the interconnect structure can comprise thru-mask structures, plugs, pillars, micropillars, or combinations thereof FIG. 2B adds a solderable material 220 to the interconnect structure of FIG. 2A, and FIG. 3B adds solderable materials 320 such as tin solder, low melting point alloys, conducting paste to the interconnect structure. The solderable material may be used to attach said device to other devices or substrates or interest or both. In one embodiment, the dissimilar material may be coated with another bondable material, for example immersion gold layer or other alloys may be coated over the dissimilar material, to attach the said device to other devices or substrates by wirebond methods.

Figure 2C:
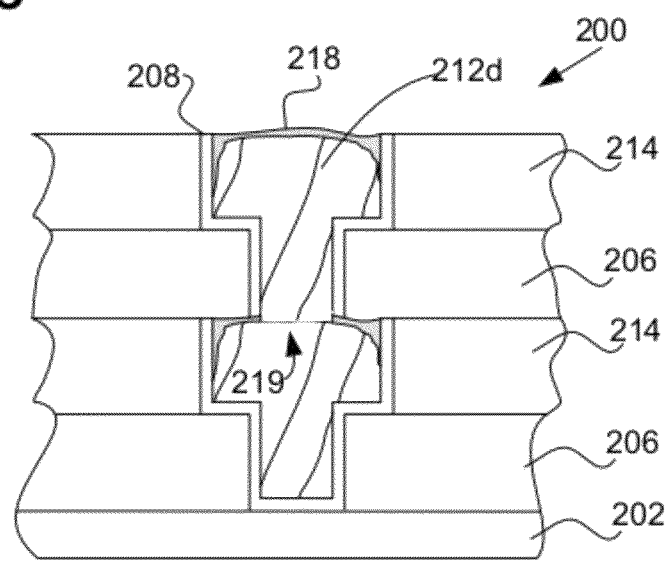

Referring to FIG. 2C, in one embodiment, portions 219 of the dissimilar material may be removed prior to coating the top adjoining conduction feature. The top adjoining material and the material beneath the dissimilar material may be the same or different. For example the dissimilar material may be disposed over a copper structure, a new wiring cavity may be disposed over the dissimilar material, portions of the dissimilar material may be removed prior to or during the filling of the wiring cavity with copper. One significant advantage in some embodiments is that the more conductive wiring is continuous and there is minimal contact resist in the structure when compared to wiring structures separated by dissimilar material or materials. In this novel structure, the grain boundary is continuous between the various wiring levels. This embodiment is illustrated in a multi-level dual-damascene structure, however it should be understood that this technique can be applied to any multi-level interconnect structure, such as single damascene, non-damascene, TSV, pillar, micropillar, and any other interconnect structures known in the art.

Figure 4A:
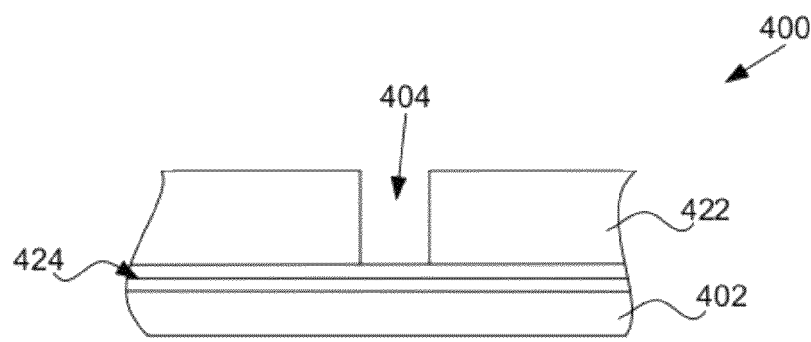
FIGS. 4A-4K illustrate yet another method of forming a semiconductor interconnect structure.

FIGS. 4A-4I illustrate the same method above only in a thru-mask implementation of a semiconductor device 400. FIG. 4A illustrates a substrate 402 having cavity 404 formed in a resist layer 422 on the substrate. The device can also include one or more barrier/seed layers 424 between the resist layer and the substrate.

Figure 4B:
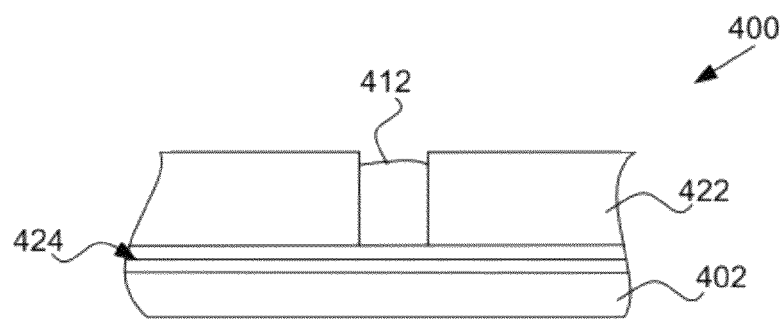

Looking to FIG. 4B, a conductor can be deposited or plated in the cavity to form the interconnect structure 412, such as with a known wet deposition method. In one embodiment, the conductor comprises copper or a nano-copper.

Figure 4C:
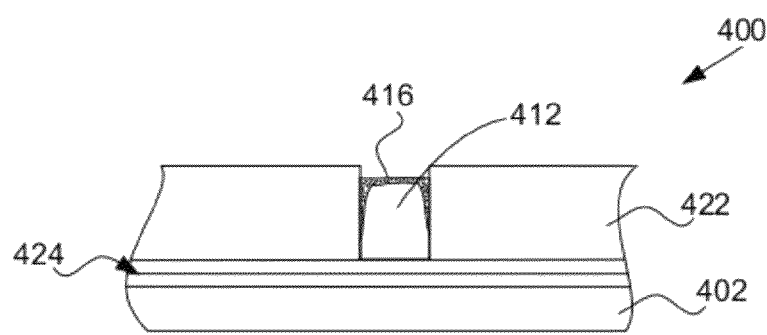

Referring now to FIG. 4C, a portion of the interconnect structure 412 can be oxidized, such as with a dry or wet oxidation process as known in the art. The oxidation process can form an oxidation layer 416 on a top surface of the interconnect structure 412, as well as along portions of the sidewalls of the interconnect structure near the resist layer. In some embodiments, the amount of the side wall to be oxidized can be at least 5%, 10%, 33%, or even 50% or more of a length of the sidewalls of the interconnect structure.

Figure 4D:
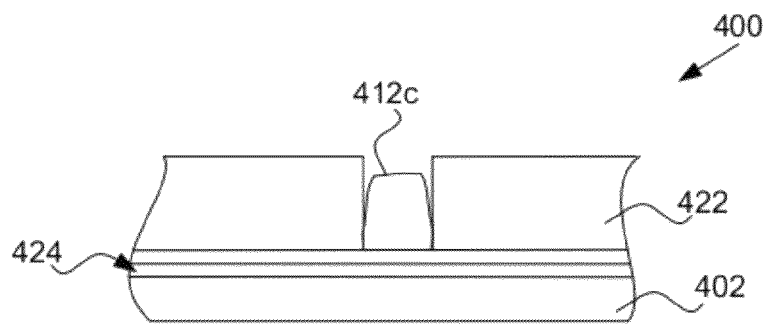
Figure 4E:
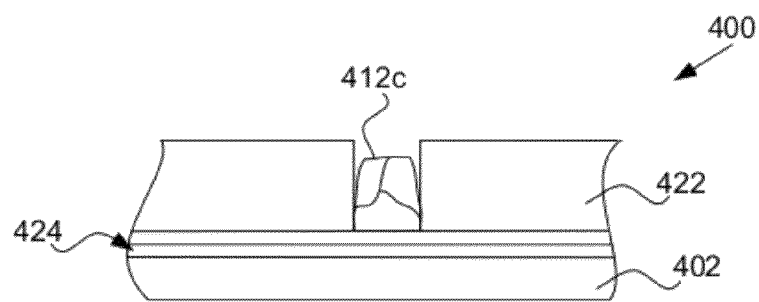

The oxidation layer 416 on interconnect structure 412 from FIG. 4C can then be removed, which essentially removes a portion of the top surface and side walls of the interconnect structure. In one embodiment, the oxidation layer 416 can be removed with a wet etch process. The new interconnect structure 412c, with a portion of its top surface and side walls removed is shown in FIG. 4D. It can be seen from FIG. 4D that small gaps appear between the sidewalls of the interconnect structure 412c and the resist layer 422. As shown, a portion of the sidewalls along approximately 50% of the length of the sidewalls has been removed. However, it should be understood that a portion of the sidewalls along any percentage of the length of the sidewalls can be removed, but preferably along at least 5%, 10%, 33%, 50%, or more of the length of the sidewalls. FIG. 4E additionally shows the interconnect structure 412c after undergoing an annealing process to enlarge the grain size of the conductor.

Figure 4F:
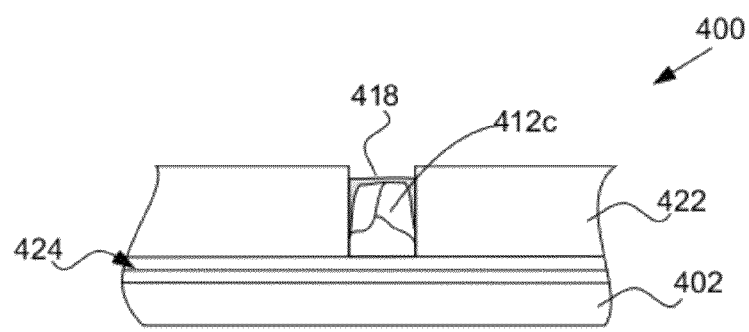

In FIG. 4F, the process continues by covering the top surface and a portion of the side walls of the interconnect structure 412c with a dissimilar material 418. In some embodiments, the dissimilar material can be a conductive material or conductive metal. In other embodiments, the dissimilar material can be a non-conductive material. In various embodiments, the dissimilar material can comprise a coupling layer, an adhesion layer, a conducting isolation layer, or a barrier layer. In other embodiments, the dissimilar material can be a nano-metal or nano-alloy, such as CoP, NiP, or NiW, or multiple layers of different alloys. In one embodiment, the dissimilar material 418 can have a grain size of between approximately 0.5 to 100 nm. In another embodiment, the dissimilar material can have a thickness ranging from between approximately 2 to 500 nm, or alternatively, from between approximately 5 to 200 nm.

Figure 4G:
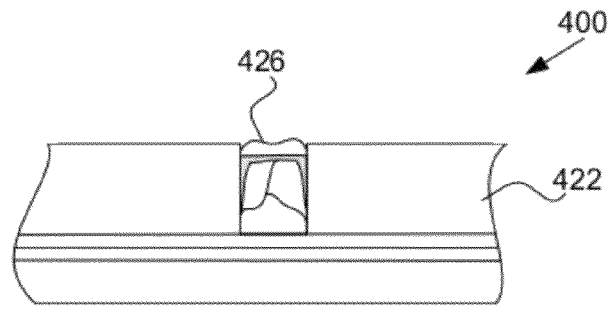
Figure 4H:
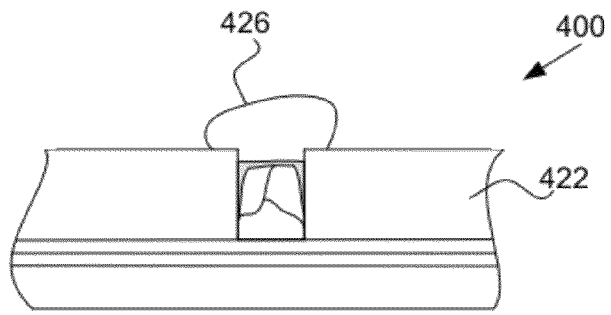
Figure 4I:
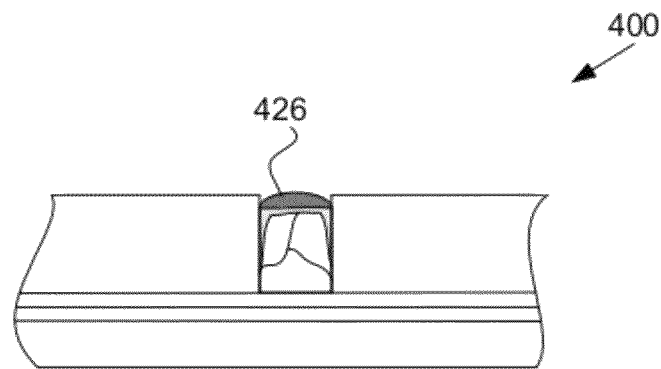
Figure 4J:
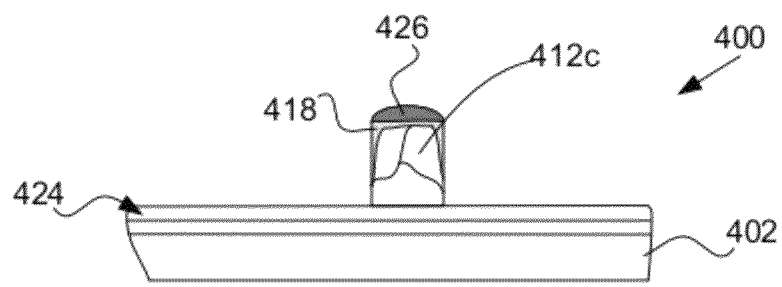
Figure 4K:
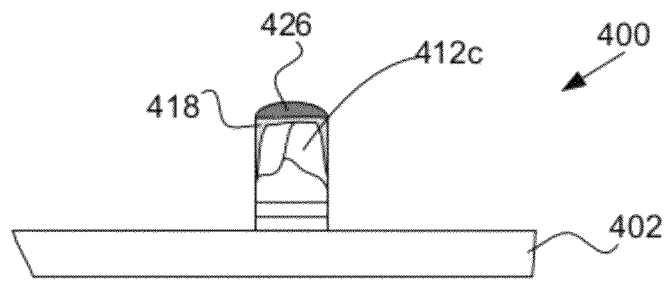

In FIG. 4G, the interconnect structure of FIG. 4F has been plated with, for example, a solderable material or fusible particles 426. As shown in FIG. 4G, the solderable material or fusible particles can be deposited over the dissimilar material, or alternatively, as shown in FIG. 4H, the solderable material or fusible particles 426 can overfill the dissimilar material and the resist layer 422 to form a "mushroom" like shape. In FIG. 4I, the solderable material or fusible particles 426 has been reflowed to attain a more desirable shape. FIG. 4J shows the interconnect structure 412c on substrate 402, having its top surface and portions of its side walls covered in a dissimilar material 418, and topped with a solderable material 426. FIG. 4J shows the device with the resist layer having been stripped away, prior to the barrier/seed layer 424 removal. FIG. 4K illustrates the device after removal of the barrier/seed layer.

Figure 5A:
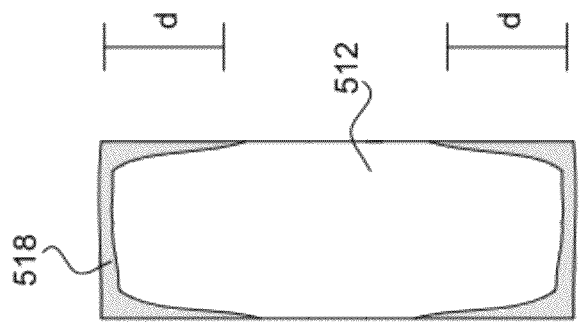
FIGS. 5A-5C illustrate a portion of the sidewalls of an interconnect structure covered with a dissimilar material.
Figure 5B:
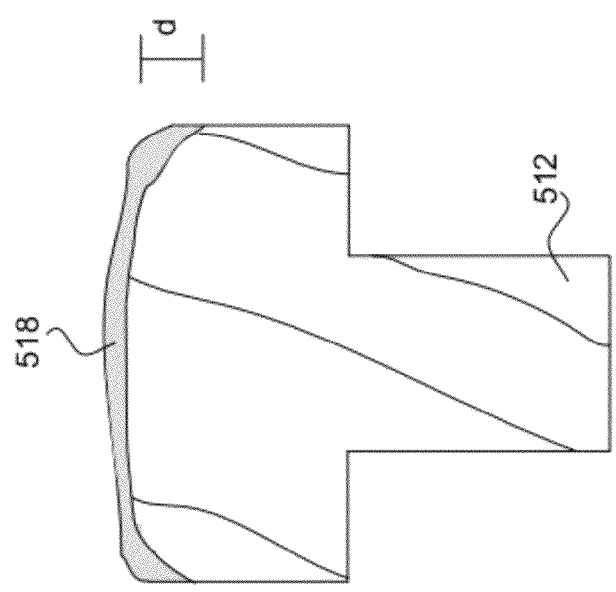
Figure 5C:
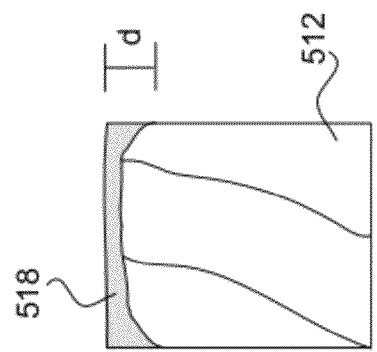

FIGS. 5A-5C illustrate various lengths of the sidewalls of interconnect structures being covered with a dissimilar material 518 according to aspects of the present invention. As described above, a portion of the sidewalls along any of the length of the sidewalls can be covered with the dissimilar material. The percentage of the length of the sidewalls to be covered with the dissimilar material can vary, but the dissimilar material preferably covers at least 5%, 10%, 33%, 50%, or more of the length of the sidewalls. In FIG. 5A, an interconnect structure 512 has a dissimilar material covering distance "d", which is approximately 10% of a length of the entire sidewall.

The height of the interconnect structure of FIG. 5A may vary between 0.03 to 300 microns, while the width or diameter may range between 0.03 to 50 microns. The structure may serve as an enhanced capped micropillar or enhanced pillar. Also as described earlier, portions of the dissimilar material may be coated with other materials for subsequent attachment to other structures. Also, portions of the dissimilar material may be removed prior to coating of adjoining structure or structures. In one embodiment, the sidewall coating may act as surface stiffeners for tall conduction features.

In FIG. 5B, a dual damascene interconnect structure 512 has a dissimilar material covering distance "d", which is approximately 33% of a length of the entire sidewall. Similarly, in FIG. 5C, a TSV interconnect structure 512 has a dissimilar material covering distance "d", which is approximately 50% of a length of the entire sidewall. These figures and embodiments are merely provided as examples to show the amount of the sidewall that can be covered with the dissimilar material.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A method of manufacturing a semiconductor device, comprising:
   forming an electrically conductive interconnect structure on a substrate, wherein:
   the electrically conductive interconnect structure partially extends within at least one trench in a dielectric region of the substrate; and
   the electrically conductive interconnect structure has a top surface and at least one sidewall;
   removing a portion of the top surface and a portion of the at least one sidewall of the electrically conductive interconnect structure to create at least one gap between the at least one sidewall of the electrically conductive interconnect structure and at least one wall of the at least one trench; and covering the top surface and a portion of the at least one sidewall of the electrically conductive interconnect structure with a dissimilar material to at least partially fill the at least one gap, wherein the dissimilar material comprises a nano-metal.

2. The method of claim 1 wherein the dissimilar material comprises a coupling layer.

3. The method of claim 1 wherein the dissimilar material comprises an adhesion layer.

4. The method of claim 1 wherein the dissimilar material comprises a conducting isolation layer.

5. The method of claim 1 wherein the dissimilar material comprises a barrier layer.

6. The method of claim 1 wherein the interconnect structure is a damascene structure.

7. The method of claim 1 wherein the interconnect structure is a dual damascene structure.

8. The method of claim 1 wherein the interconnect structure is a TSV structure.

9. The method of claim 1 wherein the interconnect structure comprises copper.

10. The method of claim 1 wherein the dissimilar material comprises CoP.

11. The method of claim 1 wherein the dissimilar material comprises NiP.

12. The method of claim 1 wherein the dissimilar material comprises NiW.

13. The method of claim 1 wherein the covering step comprises covering the top surface and a portion of the at least one sidewall of the interconnect structure with a dissimilar material having a thickness of between 2 to 500 nanometers.

14. The method of claim 1
wherein the covering step comprises covering the top surface and a portion of the at least one sidewall of the interconnect structure with a dissimilar material having a thickness of between 5 to 200 nanometers.

15. The method of claim 1 further comprising coating the dissimilar material with a solderable material.

16. The method of claim 1 wherein the dissimilar material does not etch with the interconnect structure.

17. The method of claim 1 wherein the covering step further comprises covering at least 10% of a plurality sidewalls of the interconnect structure with the dissimilar material.

18. The method of claim 1 wherein the covering step further comprises covering at least 33% of side walls the interconnect structure with the dissimilar material.

19. The method of claim 1 wherein the removing step further comprises:
oxidizing a portion of the interconnect structure; and
removing the oxidized portion of the interconnect structure.

20. The method of claim 1 wherein the removing step comprises removing a portion of a plurality of sidewalls of the interconnect structure along at least 10% of a length of the sidewalls.

21. The method of claim 1 wherein the removing step comprises removing a portion of a plurality of sidewalls of the interconnect structure along at least 33% of a length of the sidewalls.

22. A method of manufacturing a semiconductor device, comprising:

forming an electrically conductive interconnect structure on a substrate, wherein: the electrically conductive interconnect structure partially extends within at least one trench in a dielectric region of the substrate; and the electrically conductive interconnect structure has a top surface and at least one sidewall; and removing a portion of the top surface and a portion of the at least one sidewall of the electrically conductive interconnect structure to create at least one gap between the at least one sidewall of the electrically conductive interconnect structure and at least one wall of the at least one trench; and covering the top surface and a portion of the at least one sidewall of the electrically conductive interconnect structure with a dissimilar material to at least partially fill the at least one gap, the dissimilar material having a grain size between 0.5 to 100 nanometers.

23. The method of claim 22 wherein the dissimilar material comprises a coupling layer.

24. The method of claim 22 wherein the dissimilar material comprises at least one of an adhesion layer, a conducting isolation layer, or a barrier layer.

25. The method of claim 22 wherein the interconnect structure is a damascene structure.

26. The method of claim 22 wherein the interconnect structure is a TSV structure.

27. The method of claim 22 wherein the interconnect structure comprises copper.

28. The method of claim 22 wherein the dissimilar material comprises at least one of CoP, NiP or NiW.

29. The method of claim 22 wherein the covering step comprises covering the top surface and a portion of the at least one sidewall of the interconnect structure with a dissimilar material having a thickness of between 2 to 500 nanometers.

30. The method of claim 22 wherein the covering step comprises covering the top surface and a portion of the at least one sidewall of the interconnect structure with a dissimilar material having a thickness of between 5 to 200 nanometers.

31. The method of claim 22 further comprising coating the dissimilar material with a solderable material.

32. The method of claim 22 wherein the dissimilar material does not etch with the interconnect structure.

33. The method of claim 22 wherein the covering step further comprises covering at least 10% of a plurality sidewalls of the interconnect structure with the dissimilar material.

34. The method of claim 22 wherein the covering step further comprises covering at least 33% of a plurality sidewalls of the interconnect structure with the dissimilar material.

35. The method of claim 22 wherein the removing step further comprises:
oxidizing a portion of the interconnect structure; and
removing the oxidized portion of the interconnect structure.

36. The method of claim 22 wherein the removing step comprises removing a portion of a plurality of sidewalls of the interconnect structure along at least 10% of a length of the sidewalls.

37. The method of claim 22 wherein the removing step comprises removing a portion of a plurality of sidewalls of the interconnect structure along at least 33% of a length of the sidewalls.

* * * * *